(12) United States Patent
de Figueiredo et al.

(10) Patent No.: US 8,742,961 B2
(45) Date of Patent: Jun. 3, 2014

(54) GAIN AND DITHER CAPACITOR CALIBRATION IN PIPELINE ANALOG-TO-DIGITAL CONVERTER STAGES

(71) Applicant: Synopsys, Inc., Mountain View, CA (US)

(72) Inventors: Pedro Miguel Ferreira de Figueiredo, São Domingos de Rana (PT); Gonçalo Manuel Tordo Minderico, Massama (PT); Carlos Pedro dos Santos Fachada, Talaide (PT)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/742,212

(22) Filed: Jan. 15, 2013

(65) Prior Publication Data

US 2013/0187801 A1 Jul. 25, 2013

Related U.S. Application Data

(60) Provisional application No. 61/590,257, filed on Jan. 24, 2012.

(51) Int. Cl.
*H03M 1/06* (2006.01)

(52) U.S. Cl.
USPC ........... 341/118; 341/120; 341/122; 341/155; 375/316; 375/345

(58) Field of Classification Search
USPC ........................ 341/118–155; 375/316, 345
See application file for complete search history.

(56) References Cited

U.S. PATENT DOCUMENTS

| | | | |
|---|---|---|---|
| 6,894,631 B1 * | 5/2005 | Bardsley | 341/120 |
| 6,970,120 B1 | 11/2005 | Bjornsen | |
| 7,129,874 B2 | 10/2006 | Bjornsen | |
| 7,187,310 B2 * | 3/2007 | El-Sankary et al. | 341/120 |
| 7,405,681 B2 * | 7/2008 | Jonsson et al. | 341/120 |
| 7,602,323 B2 * | 10/2009 | Galton et al. | 341/118 |
| 7,830,287 B1 | 11/2010 | Huang | |
| 7,843,771 B2 * | 11/2010 | Tabatabaei | 368/118 |

(Continued)

OTHER PUBLICATIONS

Figueiredo, P., "Addressing Power and Speed Requirements of Mobile Devices with Data Converter IP," Synopsys White Paper, Oct. 2011, 8 pages, Can Be Retrieved at URL:<https://www.synopsys.com/dw/doc.php/wp/dw_dcs_pipeline_gen3_adc_wp.pdf>.

(Continued)

*Primary Examiner* — Lam T Mai
(74) *Attorney, Agent, or Firm* — Fenwick & West LLP

(57) ABSTRACT

A switching scheme is used during a calibration mode for determining calibration coefficients of each calibrated stage of a pipeline analog-to-digital converter (ADC). A calibrated stage of the pipeline ADC includes an amplifier for amplifying a residue voltage of the stage and a sampling capacitor comprising a plurality of sub-capacitors. The plurality of sub-capacitors have a first terminal connected to an input of amplifier and a second terminal connected to one or more switches that selectively couple the second terminal to the input terminal of the stage, a first reference voltage or a second reference voltage lower than the first reference voltage. During foreground calibration, a number of measurements are taken at an output of the amplifier to determine the calibration coefficient of the calibrated stage.

20 Claims, 7 Drawing Sheets

(56) References Cited

U.S. PATENT DOCUMENTS

| | | | |
|---|---|---|---|
| 8,344,920 B1* | 1/2013 | Hernes | 341/120 |
| 8,368,571 B2* | 2/2013 | Siragusa | 341/120 |
| 8,497,790 B1 | 7/2013 | Lewis et al. | |
| 2013/0187802 A1* | 7/2013 | de Figueiredo | 341/118 |

OTHER PUBLICATIONS

Hernes, B. et. al., "A 92.5mW 205MS/s 10b pipeline IF ADC implemented in 1.2V/3.3V 0.13 µm CMOS," ISSCC Dig. Tech. Papers, pp. 462-463, Feb. 2007, pp. 462-463, 615.

* cited by examiner

GAIN AND DITHER CAPACITOR CALIBRATION IN PIPELINE ANALOG-TO-DIGITAL CONVERTER STAGES

CROSS-REFERENCE TO RELATED APPLICATION

This application claims the benefit of U.S. Provisional Application 61/590,257, filed Jan. 24, 2012, which is incorporated by reference herein in its entirety. This application is also related to U.S. application Ser. No. 13/748,430 filed on Jan. 23, 2013.

BACKGROUND

1. Field of Art

The disclosure generally relates to the field of analog-to-digital converters (ADCs), and more specifically to calibrating pipeline ADCs.

2. Description of the Related Art

An analog-to-digital converter (ADC) is an electronic device that converts an analog signal (e.g., voltage signal) into a series of discrete digital values. The digital values are proportional to the magnitude of the analog signal. One type of ADC is a pipeline ADC which includes multiple stages in series. The first stage performs a quantization and outputs the resulting bits. Additionally, the first stage amplifies a residue voltage, which is the error that remains after the first stage performs the quantization. The amplified residue is output to the second stage of the pipeline ADC for further quantization. The second stage also outputs bits and generates another residue voltage that is fed to the third stage for quantization. The process continues until all the bits of the ADC have been resolved.

In order for a stage in the pipeline ADC to generate the appropriate residue voltage, the stage needs an amplifier with a certain gain. Any deviation from that gain value causes non-linearities in the transfer function of the ADC. In typical switched-capacitor implementations of a stage, deviation from the ideal gain value is caused by capacitor mismatches and finite low frequency gain of the amplifier (usually referred to as the "DC gain"). To achieve high resolution with low power dissipation, digital calibration may be used to correct the deviations. To accurately correct the deviations, it is necessary to determine calibration coefficients for the stages.

SUMMARY

Embodiments relate to a switching scheme used during a calibration mode for determining calibration coefficients of each calibrated stage of a pipeline analog-to-digital converter (ADC). Each calibrated stage of the pipeline ADC includes an amplifier for amplifying a residue voltage of the stage and a sampling capacitor between an input terminal of the stage and an input of the amplifier. The sampling capacitor includes a plurality of sub-capacitors, each having a first terminal connected to the input of the amplifier and a second terminal connected to one or more switches that selectively couple the second terminal to the input terminal of the stage, a first reference voltage or a second reference voltage higher than the first reference voltage. During foreground calibration, a number of voltage measurements are taken at the output of the amplifier when the second terminal of at least one the sub-capacitors is connected to the first reference voltage and the second terminal of the remaining sub-capacitors is connected to the second reference voltage. A calibration coefficient of the calibrated stage is calculated based on the measured output voltages of the amplifier. The calibration coefficient is used to account for a gain error of the calibrated stage during an operational mode subsequent to the calibration mode.

In one embodiment, the sub-capacitor connected to first reference voltage is alternated during different measurements in the calibration mode.

In one embodiment, a sub-capacitor is not connected to the first reference voltage more than once during a cycle of the calibration mode.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
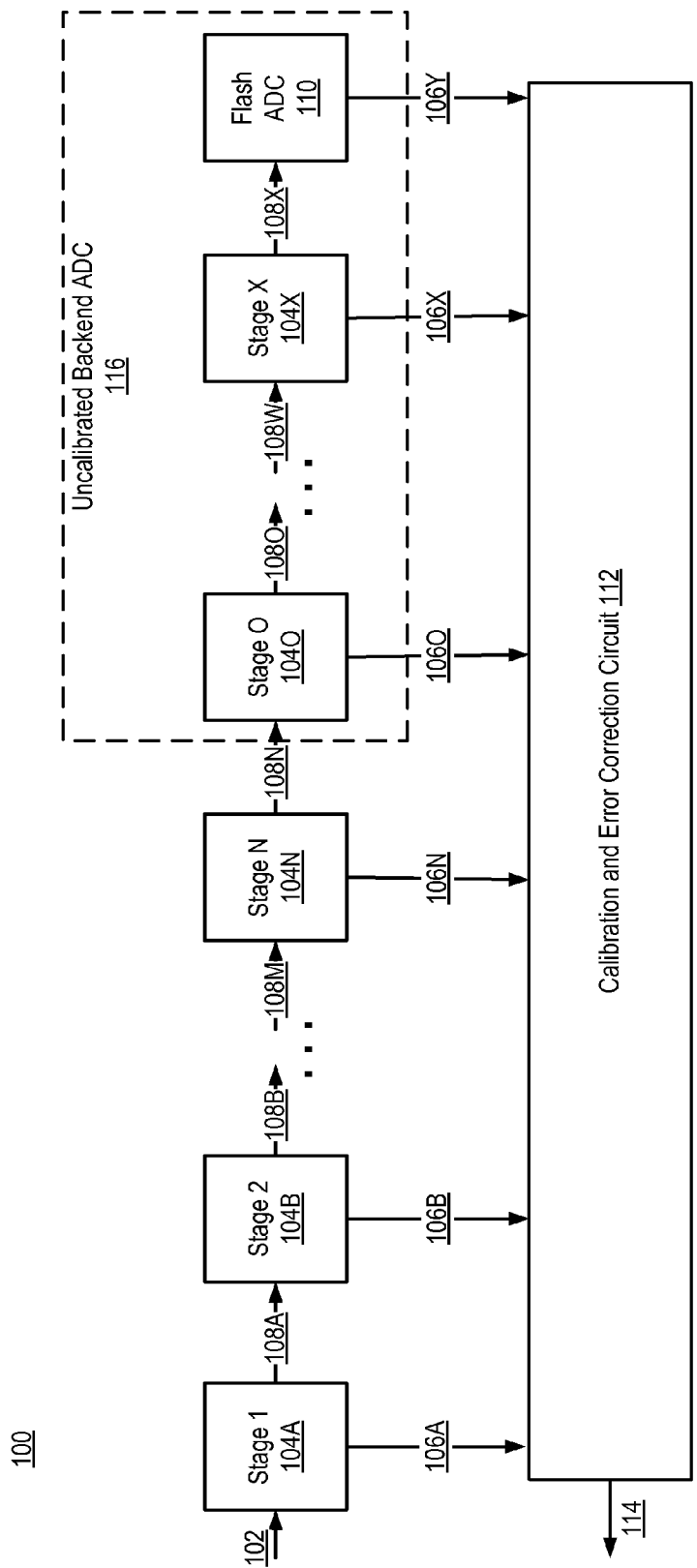
FIG. 1 is a block diagram of a pipeline ADC, according to one embodiment.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. The figures depict embodiments of the disclosed system (or method) for purposes of illustration only. It should be recognized from the following description that alternative embodiments of the structures and methods illustrated herein may be employed without departing from the principles described herein.

The figures use like reference numerals to identify like elements. A letter after a reference numeral, such as "104A," indicates that the text refers specifically to the element having that particular reference numeral. A reference numeral in the text without a following letter, such as "104," refers to any or all of the elements in the figures bearing that reference numeral.

A calibration coefficient for accounting for the gain error of a pipeline ADC's calibrated stage is determined using a switching scheme on a multiplying digital-to-analog converter (MDAC) of the stage. The MDAC includes an amplifier and a sampling capacitor comprising multiple sub-capacitors. Each of the sub-capacitors has a first terminal connected to an inverting input of the amplifier and a second terminal selectively connected to an input terminal of the stage in an operational mode and connected to a first reference voltage or a second reference voltage in a calibration mode. As part of the switching scheme a number of voltage measurements are taken at the output of the amplifier, while changing the sub-capacitors having its first terminal connected the first reference voltage and connecting the first terminals of other sub-capacitors a second reference voltage. The calibration coefficient for compensating for a gain error of the stage during the operational mode is computed based on the voltage measurements.

A pipeline analog-to-digital converter (ADC) herein refers to an analog-to-digital converter that includes multiple cascaded stages connected in series. Each of the stages receives an input voltage or a residue voltage from a previous stage at its input terminal and generates a number of bits representing digital values of the input voltage or the residue voltage at a corresponding resolution.

A gain error herein refers to a ratio between a value that is output by a non-ideal multiplying digital-to-analog converter (MDAC) and a value that would be output by an ideal MDAC.

An operational mode herein refers to a mode of a pipeline ADC in which the pipeline ADC uses its stages to digitize an input voltage into a number of bits. An operational mode may include, among other phases. a sampling phase and an amplification phase.

A calibration mode herein refers to a mode of a pipeline ADC in which the pipeline ADC is not available to digitize an input voltage into a number of bits.

Overview of Pipeline Analog-to-Digital Converter

FIG. 1 is a block diagram illustrating a pipeline ADC 100. The pipeline ADC 100 is an electronic device that digitizes an analog input voltage 102 into multiple bits 114 using multiple cascaded stages 104A-104X (hereinafter collectively referred to as "stages 104"). The multiple cascaded stages 104 are connected in series.

The first stage 104A of the pipeline ADC 100 receives an input analog voltage 102 at input terminal and generates bits 106A representing a digitized value of the input analog voltage 102 at the coarsest level. The bits 106A are fed to a calibration and error correction circuit 112. The first stage 104A also generates an amplified residue voltage 108A which represents an amplified difference between the input analog voltage 102 and a voltage reconstructed by the stage 104A using the bits 106A. The subsequent stages 104B through 104X receive the amplified residue voltages 108A through 108W at their input terminals to generate bits 106B through 106X which are fed to the calibration and error correction circuit 112. Bits 106B through 106X represent progressively less significant bits of the digitized value. The first stage 104A is referred to as the highest resolution stage and the subsequent stages 104B though 104X are referred to as lower resolution stages.

The stages 104B though 104X also generate the amplified residue voltages 108B through 108X for the next stages. Each of the amplified residue voltages 108B through 108X represents an amplified voltage difference between the amplified residue voltage 108A through 108W received from the previous stage 104 and a voltage level reconstructed at the current stage 104 using the bits 106B through 106X generated at the current stage 104.

The last stage 104X is connected to a flash ADC 110 to provide the amplified residue voltage 108X to the flash ADC 110. The flash ADC 110 digitizes the amplified residue voltage 108X to generate the least significant bits 106Y of the digitized value and feeds the least significant bits 106Y to the calibration and error correction circuit 112.

Therefore, the first stage 104A starts by resolving the most significant bits 106A and the flash ADC 110 ends by resolving the least significant bits 106Y. The number of stages 104 included in the pipeline ADC 100 and the number of bits resolved by each stage 104 and the flash ADC 110 varies depending on the embodiment. For example, without accounting for redundancy, if the pipeline ADC 100 is a 12-bit ADC, the pipeline ADC 100 may include 4 stages that resolve 2 bits each and the flash ADC 110 may resolve 4 bits for a total of 12 bits. In another example, the pipeline ADC 100 may include 3 stages that resolve 3 bits each and the flash ADC 110 may also resolve 3 bits.

The calibration and error correction circuit 112 digitally calibrates and corrects deviations from intended gain values of certain stages 104 of the pipeline ADC 100. The deviations from the intended gain values are referred to as the gain errors. In order for the pipeline ADC 100 to generate accurate digitized bits 114, a calibrated stage 104 should amplify its residue voltage by a certain gain value. Taking an example of a stage 104 that resolves 1.5 bits, the residue voltage should be amplified by a gain value of 2. However, the actual gain value of the stage 104 may deviate from the ideal gain value. Such deviance (i.e., gain error) may cause errors in the bits 106 resolved by the subsequent stages 104.

In one embodiment, the calibration and error correction circuit 112 calibrates a certain number of the higher resolution stages 104 to account for the gain error of those stages 104. In FIG. 1, stages 104A through 104N are calibrated to account for the gain errors in these stages, while stages 104O through 104X and the flash ADC 110 are not calibrated. The non-calibrated stages and the flash ADC 110 are collectively referred to herein as the "uncalibrated backend ADC 116." The reason that stages 104O through 104X of the backend ADC 116 do not need to be calibrated is because the performance requirements of these stages 104 are relaxed and as a result their gain errors have a negligible effect on the accuracy of the output 114. The calibration and error correction circuit 112 calibrates by correcting the bits 106A through 106N output by the calibrated stages 104A through 104N. The calibration and error correction circuit 112 outputs the digitized bits 114 of the pipeline ADC 100.

Figure 2:
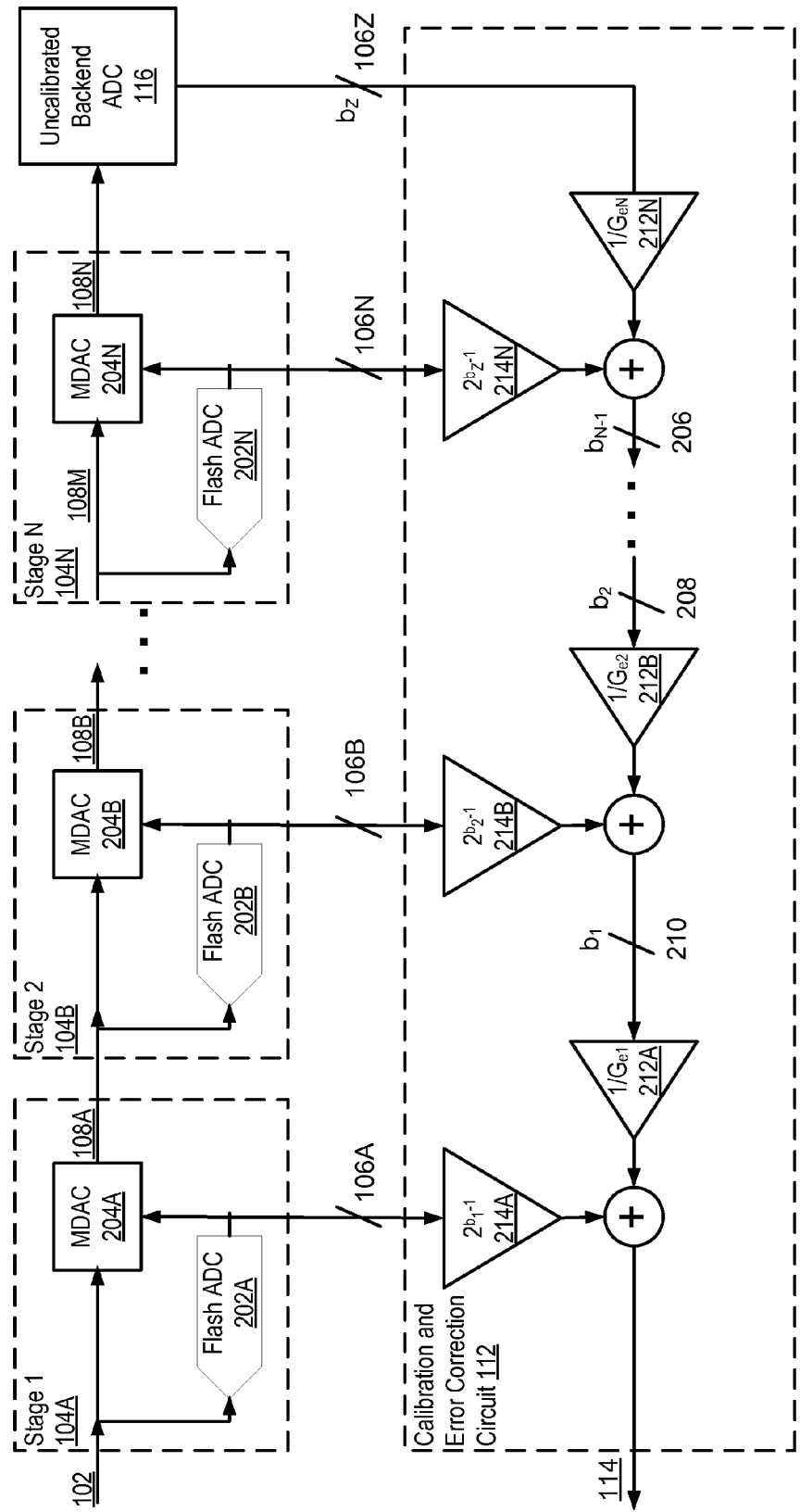
FIG. 2 is a block diagram illustrating stages and a calibration and error correction circuit of a pipeline ADC in more detail, according to one embodiment.

FIG. 2 is a block diagram illustrating the stages 104 and the calibration and error correction circuit 112 of the pipeline ADC 100 in more detail, according to one embodiment. Each stage 104A through 104X of the pipeline ADC 100 includes a flash ADC 202A through 202X (not all shown) and a multiplying digital-to-analog converter (MDAC) 204A through 204X (not all shown). The flash ADC 202 of each stage 104 digitizes a received voltage to generate the bits 106 of the stage 104. The flash ADC 202A of the first stage 104A digitizes the input voltage 102 and the flash ADCs 202B through 202N of the subsequent stages 104B through 104N digitize an amplified residue voltage 108A through 108N received from a higher resolution stage 104 in the series of stages 104. As an example, the flash ADC 202B of the second stage 104B digitizes the amplified residue voltage 108A output by the first stage 104A.

The MDAC 204 of a stage 104 amplifies the difference between the voltage digitized by the flash ADC 202 and a voltage reconstructed based on the bits 106 of the stage 104 (i.e., the MDAC 204 amplifies the residue voltage of the stage 104). In one embodiment, the MDACs 204 are implemented as switched capacitor circuits, as described below in detail with reference to FIG. 3. Non-idealities of an MDAC 204 (e.g., capacitor mismatches and amplifier DC gain) cause a gain error $G_e$ in the transfer function of the MDAC 204. The gain error $G_e$ is the ratio between the intended amplification of the residue voltage and the actual amplification of the residue voltage. The MDAC 204 of each stage 104 may have a different gain error Ge.

The calibration and error correction circuit 112 performs digital computations to account for the gain errors $G_e$ of the calibrated stages 104A through 104N and correct those stages' bits 106A through 106N. For each calibrated stage 104A through 104N, the calibration and error correction circuit 112 calculates a calibration coefficients $1/G_e$ and uses the calibration coefficient $1/G_e$ to account for the stage's gain error $G_e$. In one embodiment, the digital gain calibration coefficient $1/G_e$ of a stage 104 is the inverse of the stage's gain error $G_e$. The digital gain calibration coefficients $1/G_e$ of calibrated stages 104A through 104N are represented by elements 212A through 212N in FIG. 2.

In one embodiment, the calibration and error correction circuit 112 first accounts for the gain error $G_{eN}$ of lowest resolution calibrated stage 104N. The bits 106Z output by the backend ADC 116 (stages 104O through 104X and the flash ADC 110) are multiplied by the calibration coefficient $1/G_{eN}$ 212N of stage 104N. The bits 106Z multiplied by the calibration coefficient $1/G_{eN}$ 212N are summed with the bits 106N of the stage 104N multiplied by $2^{\wedge}(b_Z-1)$ 214N, where "$b_Z$" is the resolution of the uncalibrated backend ADC 116. The result of the summation is the corrected bits 206 of the stage 104N and the backend ADC 116. The corrected bits 206 are used to account for the gain error $G_e$ of the next higher resolution stage 104 in the series of stages 104.

Each of the higher resolution stages, such as 104A and 104B, sees a backend ADC that is composed of the lower resolution calibrated stages 104 and the uncalibrated backend ADC 116. The calibration and error correction circuit 112 accounts for the gain error $G_e$ of each higher resolution calibrated stage 104 by multiplying the corrected bits of its backend ADC (the lower resolution calibrated stages 104 and the backend ADC 116) by the stage's 104 calibration coefficient $1/G_e$ 212. Additionally, the multiplied corrected bits are summed with the bits 106 of the stage 104 multiplied by $2^{\wedge}(b-1)$ 214, where "b" is the resolution of its backend ADC.

For example, to account for the gain error $G_{e1}$ of the first stage 104A, the corrected bits 210 of its backend ADC (that is composed of the calibrated stages 104B through 104N and the backend ADC 116) are multiplied by the calibration coefficient $1/G_{e1}$ 212A of the first stage 104A. Further, the multiplied bits are summed with the first stage's 104A bits multiplied by $2^{\wedge}(b_1-1)$ 214A, where $b_1$ is the resolution of its backend ADC. The result of the summation are the bits 114 output by the pipeline ADC 100. Therefore, the gain errors are accounted for in a nested fashion.

Example Switched-Capacitor Circuit

Figure 3A:
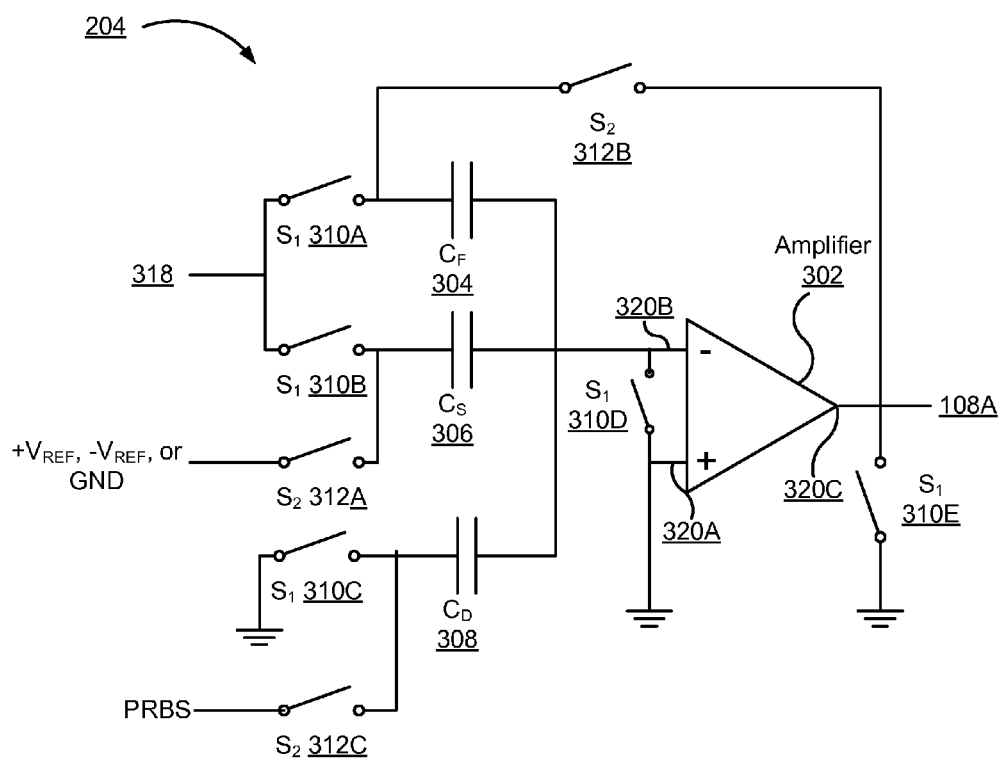
FIGS. 3A-3C are diagrams of a switched-capacitor circuit that performs the functions of a multiplying digital-to-analog converter included in a calibrated stage, according to one embodiment.

FIG. 3A is a circuit diagram illustrating the MDAC 204A through 204N of a calibrated stage 104A through 104N embodied as a switched-capacitor circuit, according to one embodiment. The MDAC 204 of a calibrated stage includes an amplifier 302, a feedback capacitor $C_F$ 304, a sampling capacitor $C_S$ 306, and a dither capacitor $C_D$ 308, a first set of switches $S_1$ 310A through 310E (hereinafter collectively referred to as "first set of switches 310"), and a second set of switches $S_2$ 312A through 312C (hereinafter collectively referred to as "second set of switches 312"). One terminal of each capacitor 304, 306, 308 is connected to the inverting input 320B of the amplifier 302. The second terminal of feedback capacitor $C_F$ 304 is connected to switches $S_1$ 310A and $S_2$ 312B. The second terminal of sampling capacitor $C_S$ 306 is connected to switches $S_1$ 310B and $S_2$ 312A. The second terminal of dither capacitor $C_D$ 308 is connected to switches $S_1$ 310C and $S_2$ 312C.

Through the use of the first set of switches 310 and the second set of switches 312, the MDAC 204 may be placed in a sampling phase or in an amplification phase of the operational mode. The MDAC 204 is placed in a sampling phase while the flash ADC 202 of the stage 104 is digitizing a voltage received at its input terminal (e.g., input voltage 102 for the first stage 104A). The MDAC 204 is then placed in an amplification phase after the flash ADC 202 digitizes the voltage in order to generate the amplified residue voltage 108 for feeding to the next stage 104. After the amplification phase, the MDAC 204 may return to the sampling phase.

Figure 3B:
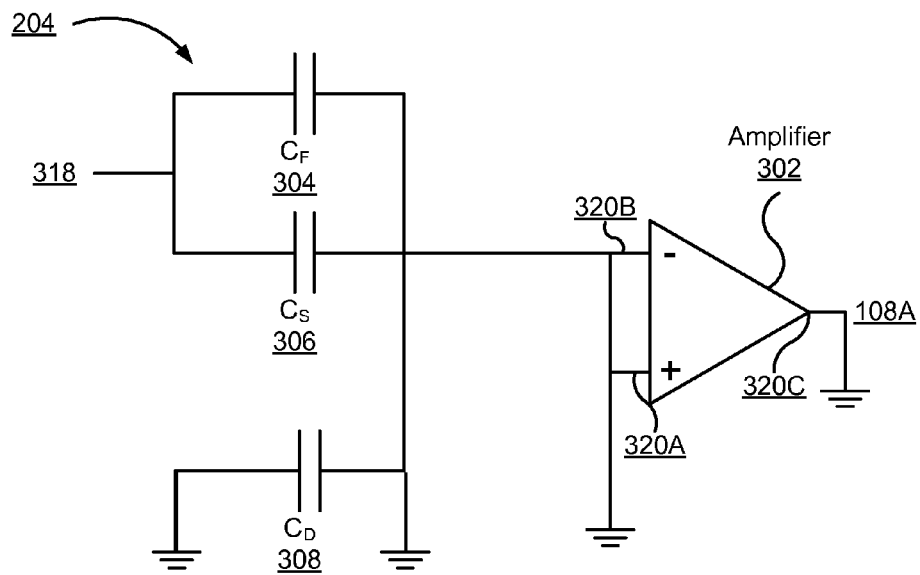

FIG. 3B is a circuit diagram illustrating the MDAC 204 in the sampling phase, according to one embodiment. During the sampling phase of the MDAC 204, the first set of switches $S_1$ 310 is closed and the second set of switches $S_2$ 312 is opened. Closing the first set of switches $S_1$ 310 causes feedback capacitors $C_F$ 304 and sampling capacitors $C_S$ 306 to be connected to a voltage 318 received at the input terminal of the stage 104 and dither capacitor $C_D$ 308 to be connected to ground. Voltage 318 is the voltage that is digitized by the flash ADC 202 of the stage 104. For example, referring to FIG. 1, voltage 318 for the first stage 104A is the input voltage 102 of the pipeline ADC 100. In subsequent stages 104B through 104X, voltage 318 is the amplified residue voltages 108A through 108W.

Figure 3C:
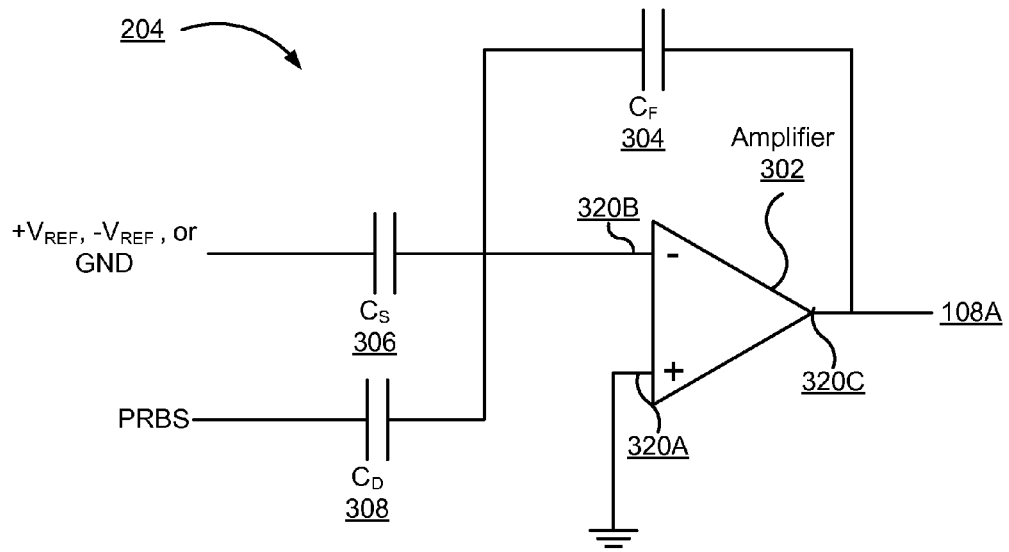

FIG. 3C is a circuit diagram illustrating the MDAC 204 in the amplification phase of the operational mode subsequent to the sampling phase of the operational mode, according to one embodiment. During the amplification phase of the MDAC 204, the first set of switches 310 is opened and the second set of switches 312 is closed. The amplification phase results in feedback capacitor $C_F$ 304 becoming connected to the output 320C of the amplifier 302 and depending on the output 106 of the flash ADC 202, sampling capacitor $C_S$ 306 becomes connected to a positive reference voltage ($+V_{REF}$), a negative reference voltage ($-V_{REF}$) or ground (GND). In one embodiment, if the output 106A of the flash ADC 202 is a value of one, $C_S$ 306 is connected to the positive reference voltage. Also, if the output 106A is a value of zero, $C_S$ 306 is connected to ground and if the output 106A is a negative one value, $C_S$ 306 is connected to the negative reference voltage.

Further, a Pseudo-Random Binary Sequence (PRBS) is injected through dither capacitor $C_D$ 308 for background calibration of the stage 104 during the operational mode, as described in the background calibration section below. In one embodiment, a ±1 PRBS is injected by connecting capacitor $C_D$ 308 to the positive reference voltage or the negative reference voltage.

In one embodiment, an MDAC 204 with the same circuit as that of FIGS. 3A-3C is used for each uncalibrated stage 104O through 104X included in the uncalibrated backend ADC 116 except that the MDAC 204 does not include the dither capacitor $C_D$ 308 and switches $S_1$ 310C and $S_2$ 312C. Therefore, no PRBS is injected for the uncalibrated stages 104O through 104X.

Example Calibration for MDAC of Calibrated Stages

As discussed above with reference to FIG. 2, for each calibrated stage 104A through 104N, a digital gain calibration coefficient $1/G_e$ is calculated by the calibration and error correction circuit 112 to account for the gain error $G_e$ of the MDAC 204 included in the stage 104. The gain error $G_e$ of the MDAC 204 is caused, for example, by the DC gain of the amplifier 302 and mismatches of $C_F$ 304 and $C_S$ 306.

During calibration, the calibration and error correction circuit 112 determines the calibration coefficient $1/G_e$ of each stage 104 using the MDAC 204 of the stage 104. In one embodiment, calibration can be performed in calibration mode, the operational mode or both modes.

Background calibration herein refers to the calibration of the stages 104 performed by the calibration and error correction circuit 112 while the pipeline ADC 100 is in the operational mode. During the operational mode, the pipeline ADC 100 uses the stages 104 to digitize an input voltage 102 into bits 114. Therefore, during this mode the flash ADCs 202 digitize and MDACs 204 go through the sampling and amplification phases. On the other hand, foreground calibration refers to the calibration of the stages 104 performed while the pipeline ADC 100 is in the calibration mode. The calibration mode occurs during the startup time of the pipeline ADC 100 when the pipeline ADC 100 is not yet operational to receive an input voltage 102 and produce the bits 114. In one embodiment, in the calibration mode, the input 102 to the pipeline ADC 100 is ignored and the MDACs 204 of the stages 104 go through the sampling and amplification phases in order to determine the calibration coefficients $1/G_e$ of the calibrated stages.

In one embodiment, the calibration and error correction circuit 112 performs foreground calibration to generate initial calibration coefficients $1/G_e$ and background calibration to update the initial calibration coefficients $1/G_e$. The background calibration allows the correction circuit 112 to adjust the calibration coefficients $1/G_e$ in order to account for changes in the stage's gain errors $G_e$ which occur while the ADC 100 is operating in an operational mode due, for example, to temperature and supply voltage changes.

To determine the calibration coefficient $1/G_e$ of a calibrated stage 104A through 104N during foreground calibration, zero volts are sampled during the sampling phase of the stage's MDAC 204 and a switching scheme is applied to sampling capacitor $C_S$ 306 of the MDAC 204 during the amplification phase. In one embodiment, sampling capacitor $C_S$ 306 is implemented using multiple sub-capacitors connected in parallel. In one embodiment, each of the sub-capacitors is nominally equal to the dither capacitor $C_D$ 308.

Therefore, in this embodiment, the number of sub-capacitors that make up the sampling capacitor $C_S$ 306 depends on the size of the sampling capacitor $C_S$ 306 and the size of the dither capacitor $C_D$ 308. For example, for a 1.5 bit stage with capacitors $C_F$ 304 and $C_S$ 306 having a value of C and the dither capacitor $C_D$ 308 having a value of C/4, four sub-capacitors, each with a value of C/4 would be used to collectively form capacitor $C_S$ 306.

In one embodiment, the switching scheme used to calculate the calibration coefficient $1/G_e$ of the calibrated stage 104 is applied to the sub-capacitors of capacitor $C_S$ 306 during the amplification phase of the MDAC 204. The switching scheme includes performing at least N measurements of the amplified residue voltage 108 of the stage 104 (voltage at output 320C of the amplifier 302), where N is the number of sub-capacitors making up capacitor $C_S$ 306. In each of the N measurements, N−1 of the sub-capacitors are connected to the positive reference voltage, one of the sub-capacitors is connected to ground, dither capacitor $C_D$ 308 is connected to ground, and feedback capacitor $C_F$ 304 is connected to the output 320C of the amplifier 302. A different sub-capacitor is connected to ground during each of the N measurements. Therefore, during the N measurements in a cycle of foreground calibration, each sub-capacitor is connected to ground once.

In another embodiment, instead of connecting one the sub-capacitors to ground during each measurement, a sub-capacitor is connected to a reference voltage that is different from the positive reference voltage. For example, the different reference voltage may be a value that is less than the positive reference voltage. Therefore, in this embodiment, during each measurement, N−1 of the sub-capacitors are connected to the positive reference voltage and one of the sub-capacitors is connected to the different reference voltage.

In one embodiment, the measurements are performed by the subsequent stage 104 in the pipeline ADC 100 and provided to the calibration and error correction circuit 112 for calculation of the calibration coefficient $1/G_e$ of the calibrated stage 104. In one embodiment, the measurements are provided to the calibration and error correction circuit 112 in a digital form. The calibration and error correction circuit 112 averages the N measurements of the amplified residue voltages 108 and calculates the calibration coefficient $1/G_e$ of the calibrated stage 104 using the equation below, where $V_{OMEASavg}$ is the average of the N measurements.

$$1/G_e = \frac{\left(\frac{N-1}{N}\right) * V_{REF}}{V_{OMEASavg}} \quad (1)$$

In one embodiment, an additional measurement (N+1 measurement) of the amplified residue voltage 108 is made to determine the mismatch between dither capacitor $C_D$ 308 and sampling capacitor $C_S$ 306. The mismatch is used during background calibration to remove the PRBS, as described in the background calibration section below. If the mismatch is not determined during foreground calibration, the mismatch is assumed to be zero during background calibration. Assumption that the mismatch is zero will result in an inaccurate calculation of a calibration coefficient $1/G_e$ during the background calibration. To perform the N+1 measurement of the amplified residue voltage 108, each of the sub-capacitors is connected to the positive reference voltage, dither capacitor $C_D$ 308 is connected to the negative reference voltage, and feedback capacitor $C_F$ 304 remains connected to the output 320C of the amplifier 302. The calibration and error correction circuit 112 calculates the mismatch of dither capacitor $C_D$ 308 and sampling capacitor $C_S$ 306 by taking the ratio of the amplified residue voltage 108 measured during the N+1 measurement and $V_{OMEASavg}$.

Figure 4A:
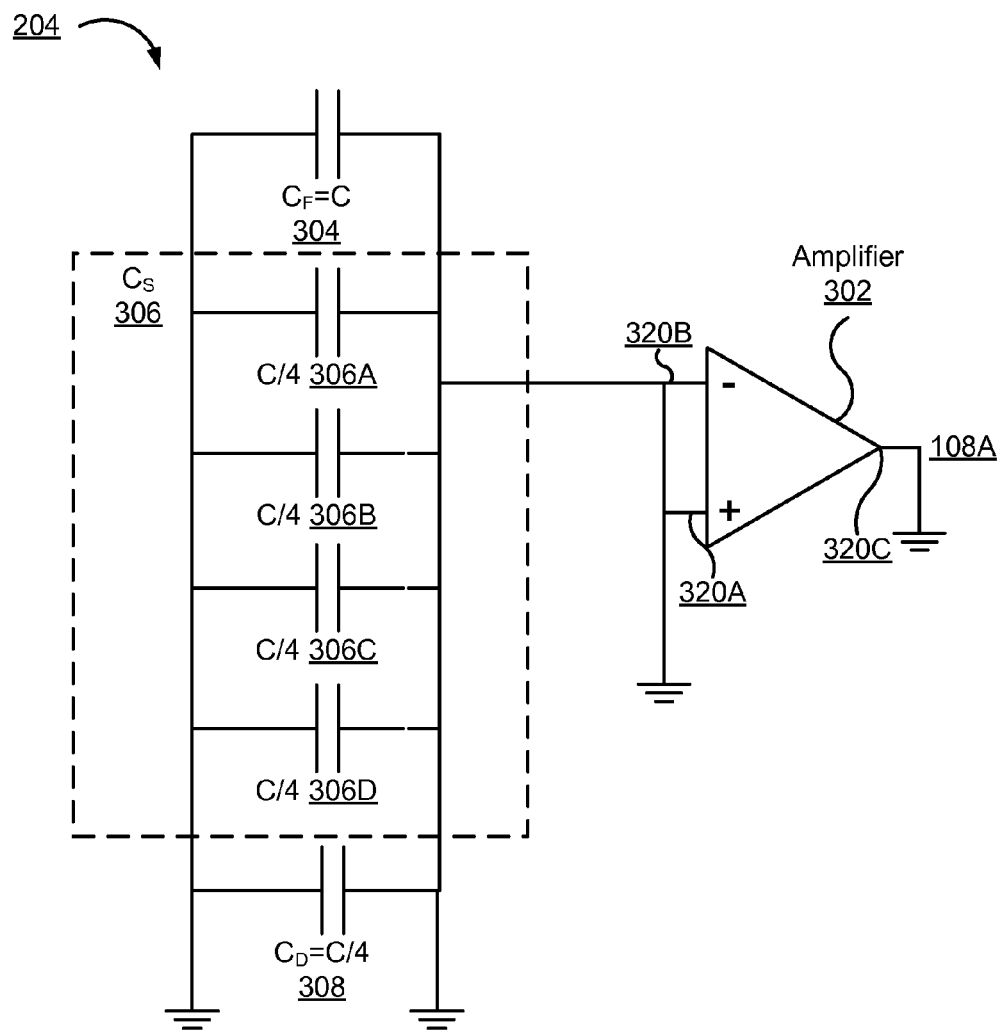
FIGS. 4A and 4B are diagrams of a multiplying digital-to-analog converter included in a 1.5 bit calibrated stage, according to one embodiment.

As an example of the calculations performed for a calibrated stage 104, assume that (i) the MDAC 204 is used for a 1.5 bit calibrated stage, (ii) capacitors $C_F$ 304 and $C_S$ 306 have a capacitance of C, (iii) dither capacitor $C_D$ 308 has capacitance of C/4, and (iv) the sampling capacitor $C_S$ 306 is made up of four sub-capacitors of equal capacitance (C/4). FIG. 4A illustrates the MDAC 204 in the sampling phase according to this example. As can be seen in FIG. 4A, sampling capacitor $C_S$ 306 is made up of four sub-capacitors 306A through 306D of nominally equal value. Additionally, it can be seen that the voltage at the input terminal of the stage is 0V.

During the amplifying phase of the MDAC 204, four measurements are taken at the output 320C of the amplifier 302 while changing the sub-capacitor 306A through 306D connected to ground. The four measurements are sent to the calibration and error correction circuit 112 to calculate the calibration coefficient $1/G_e$ of the stage 104. A fifth measurement is also made at the output 320C to determine the mismatch of capacitors $C_D$ 308 and $C_S$ 306.

Figure 4B:
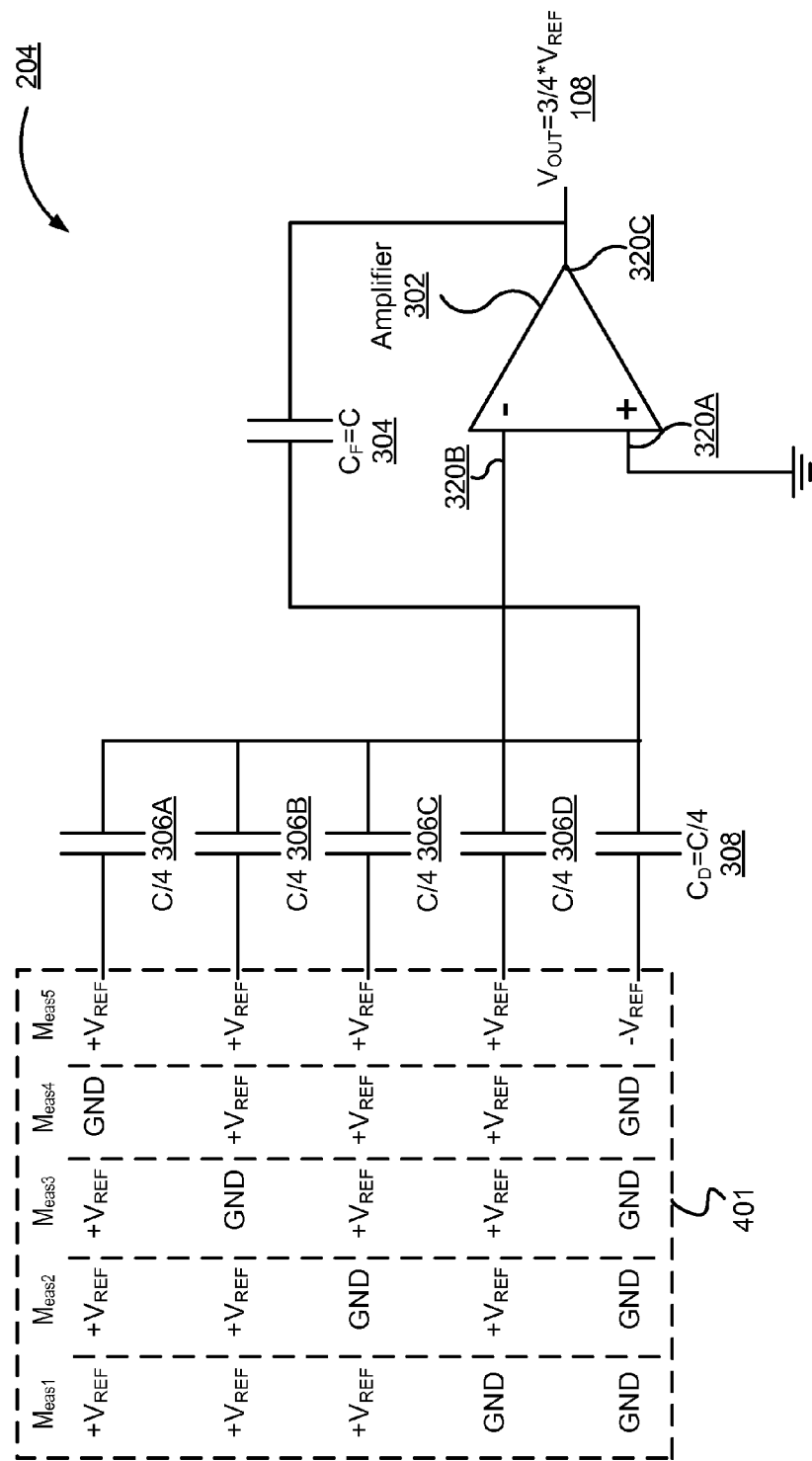

FIG. 4B illustrates how the sub-capacitors 306A through 306D and $C_D$ 308 are connected throughout the five measurements (Meas1 through Meas5), according to one embodiment. During the first four measurements (Meas1 through Meas4), each of the sub-capacitors is connected to ground once while the other sub-capacitors are connected to the positive reference voltage as shown in a corresponding column of table 401.

Specifically, for the first measurement (Meas1), sub-capacitor 306D and the dither capacitor $C_D$ 308 are connected to ground (GND) while sub-capacitors 306A through 306C are connected to the positive reference voltage (+$V_{REF}$). For the second measurement (Meas2), sub-capacitor 306C and dither capacitor $C_D$ 308 are connected to ground (GND) while sub-capacitors 306A, 306B, and 306D are connected to the positive reference voltage (+$V_{REF}$). For the third measurement (Meas3), sub-capacitor 306B and the dither capacitor $C_D$ 308 are connected to ground (GND) while sub-capacitors 306A, 306C, and 306D are connected to the positive reference voltage (+$V_{REF}$). For the fourth measurement (Meas4) sub-capacitor 306A and the dither capacitor $C_D$ 308 are connected to ground (GND) while sub-capacitors 306B, 306C, and 306D are connected to the positive reference voltage (+$V_{REF}$). For the fifth measurement (Meas5) sub-capacitors 306A through 306D are connected to the positive reference voltage (+$V_{REF}$) and dither capacitor $C_D$ 308 is connected to the negative reference voltage (-$V_{REF}$).

Because one of the sub-capacitors is connected to ground each time the output voltage 108 for the first four measurements Meas1 through Meas4, the output residue voltage 108 is near $((N-1)/N)*V_{REF}$, where N is the number of sub-capacitors that make up sampling capacitor $C_S$ 306. In the example of FIG. 4B, N equals four. Therefore, in this example, the output residue voltage 108 is near ¾ of the full output scale, which is a representative range for normal operation of the amplifier 302. This avoids the extremes of the output range of the amplifier 302. Forcing the amplifier 302 into the extremes of the output range may cause an error in the measured amplified residue voltage 108 and also result in errors in the calculated calibration coefficient $1/G_e$.

The equations below show how the gain error of this 1.5-bit calibrated stage is calculated by the calibration and error correction circuit 112. Since capacitor $C_S$ 306 is divided into four equally sized capacitors, the representative equation of capacitor $C_S$ 306 is expressed by the following equation:

$$C_S = \sum_{i=1}^{4} \left( \frac{C}{4} + \delta C_i \right) \quad (2)$$

where $\delta C_i$, (i=1 . . . 4) is the mismatch error as to how much each sub-capacitor deviates from its ideal value (C/4).

The amplified residue voltage 108 of the 1.5 bit stage is expressed by the following equation:

$$v_{OUT} = G_e \left[ \left(1 + \frac{C_S}{C_F}\right) V_{IN} - d \frac{C_S}{C_F} V_{REF} - r \frac{C_D}{C_F} V_{REF} \right] \quad (3)$$

where $V_{IN}$ is the input voltage 102, d={-1,0,+1} is the decision of the flash ADC 202 and r={-1,+1} is the PRBS (when the capacitor $C_D$ 308 is unused, r=0).

The output voltages 108 of the first four measurements is (using $V_{IN}$=0, d=-1, r=0) are expressed by the following equations:

$$v_{OMEAS1} = G_e \frac{\sum_{i=1}^{3} \left( \frac{C}{4} + \delta C_i \right)}{C_F} V_{REF} \quad (4)$$

$$v_{OMEAS2} = G_e \frac{\sum_{i=1}^{2} \left( \frac{C}{4} + \delta C_i \right) + \left( \frac{C}{4} + \delta C_4 \right)}{C_F} V_{REF} \quad (5)$$

$$v_{OMEAS3} = G_e \frac{\sum_{i=3}^{4} \left( \frac{C}{4} + \delta C_i \right) + \left( \frac{C}{4} + \delta C_1 \right)}{C_F} V_{REF} \quad (6)$$

$$v_{OMEAS4} = G_e \frac{\sum_{i=1}^{4} \left( \frac{C}{4} + \delta C_i \right)}{C_F} V_{REF} \quad (7)$$

The average of the four measurements is:

$$v_{OMEASavg} = \frac{v_{OMEAS1} + v_{OMEAS2} + v_{OMEAS3} + v_{OMEAS4}}{4} \quad (8)$$

The measured calibration coefficient $1/G_{eMEAS}$ of the 1.5 bit calibrated stage is given by:

$$1/G_{eMEAS} = \frac{3/4 V_{REF}}{v_{OMEASavg}} \quad (9)$$

Equations 10 and 11 below show how the mismatch between capacitors $C_D$ 308 and $C_S$ 306 is calculated. Using $V_{IN}$=0, d=-1, r=1 in equation 3, the output voltage 108 of the fifth measurement can be expressed as follows:

$$v_{OMEAS5} = G_e V_{REF} \left[ \frac{C_S}{C_F} - \frac{C_D}{C_F} \right] \quad (10)$$

The ratio between $C_D$ 308 and $C_S$ 306 is given by:

$$\frac{C_D}{C_S} = 1 - \frac{3}{4} \frac{v_{OMEAS5}}{v_{OMEASavg}} \quad (11)$$

By using the switching scheme described above with reference to FIG. 4B, the calibration coefficient $1/G_e$ of the calibrated stage 104 can be determined accurately. An accurate determination of the calibration coefficient $1/G_e$ allows, among other things, a relaxed design of the amplifier 302 because it can be simpler and be optimized for lower power consumption. Additionally, an accurate determination of the mismatch between the dither capacitor $C_D$ 308 and the sampling capacitor $C_S$ 306 allows improved performance during background calibration.

In one embodiment, a cycle of foreground calibration begins with determining the calibration coefficient $1/G_e$ of the lowest resolution calibrated stage 104N. After the calibration coefficient $1/G_e$ of stage 104N is determined, the calibration coefficient $1/G_e$ of each of the higher resolution stages is determined in successive order.

The background calibration is performed while the pipeline ADC 100 is in the operational mode (e.g., while digitizing the input voltage 102). In one embodiment, to perform background calibration of a calibrated stage 104, a PRBS is injected in the MDAC 204 of the stage 104 through dither capacitor $C_D$ 308 in the amplification phase, as shown in FIG. 3C. In one embodiment, prior to the calibration and error correction circuit 112 multiplying the bits of the backend ADC (lower resolution stages 104 and the flash ADC 110) seen by the calibrated stage 104 by the stage's 104 calibration coefficient $1/G_e$ 212, as described in FIG. 2, the calibration and error correction circuit 112 removes the injected PRBS. The calibration and error correction 112 circuit removes the PRBS by subtraction in the digital domain. In one embodiment, to remove the PRBS, the calibration and error correction circuit 112 subtracts the following:

$$G_e \times PRBS \times \left(\frac{2^b}{2}\right) \times \left(\frac{C_D}{C_S}\right) \qquad (12)$$

The gain error ($G_e$) is the inverse of the calibration coefficient $1/G_e$ previously calculated for the calibrated stage 104 (e.g., during foreground calibration or a previous cycle of background calibration) and being used by the correction circuit 112 for calibration of the stage 104. PRBS takes the value $\{+1,-1\}$ and in $2^b/2$, b is the resolution of the backend ADC seen by the calibrated stage 104 stage. $C_D/C_S$ is the mismatch of the dither capacitor $C_D$ 308 and the sampling capacitor $C_S$ 306 calculated during foreground calibration for the calibrated stage 104. Thus, the calculation of $C_D/C_S$ during foreground calibration allows proper subtraction by the calibration and error correction circuit 112.

The calibration and error correction circuit 112 calculates the correlation between the digital output 114 and the PRBS to determine whether there are any PRBS remnants after the subtraction. If the calculated correlation is equal to zero, it signifies that the calibration coefficient $1/G_e$ being used by the correction circuit 112 for calibration of the stage 104 is the correct value. Since the calibration coefficient $1/G_e$ is correct, the calibration and error correction circuit 112 makes no adjustments to the calibration coefficient $1/G_e$.

However, if the calculated correlation is less than or greater than zero, it signifies that the calibration coefficient $1/G_e$ is inaccurate and needs to be adjusted. The calibration and error correction circuit 212 adjusts the calibration coefficient $1/G_e$ to minimize the correlation result. Therefore, the background calibration allows the adjustment of the calibration coefficient $1/G_e$ values in the operational mode, where the adjustments may be necessary due to temperature and supply voltage changes, as an example.

Process Flow

Figure 5:
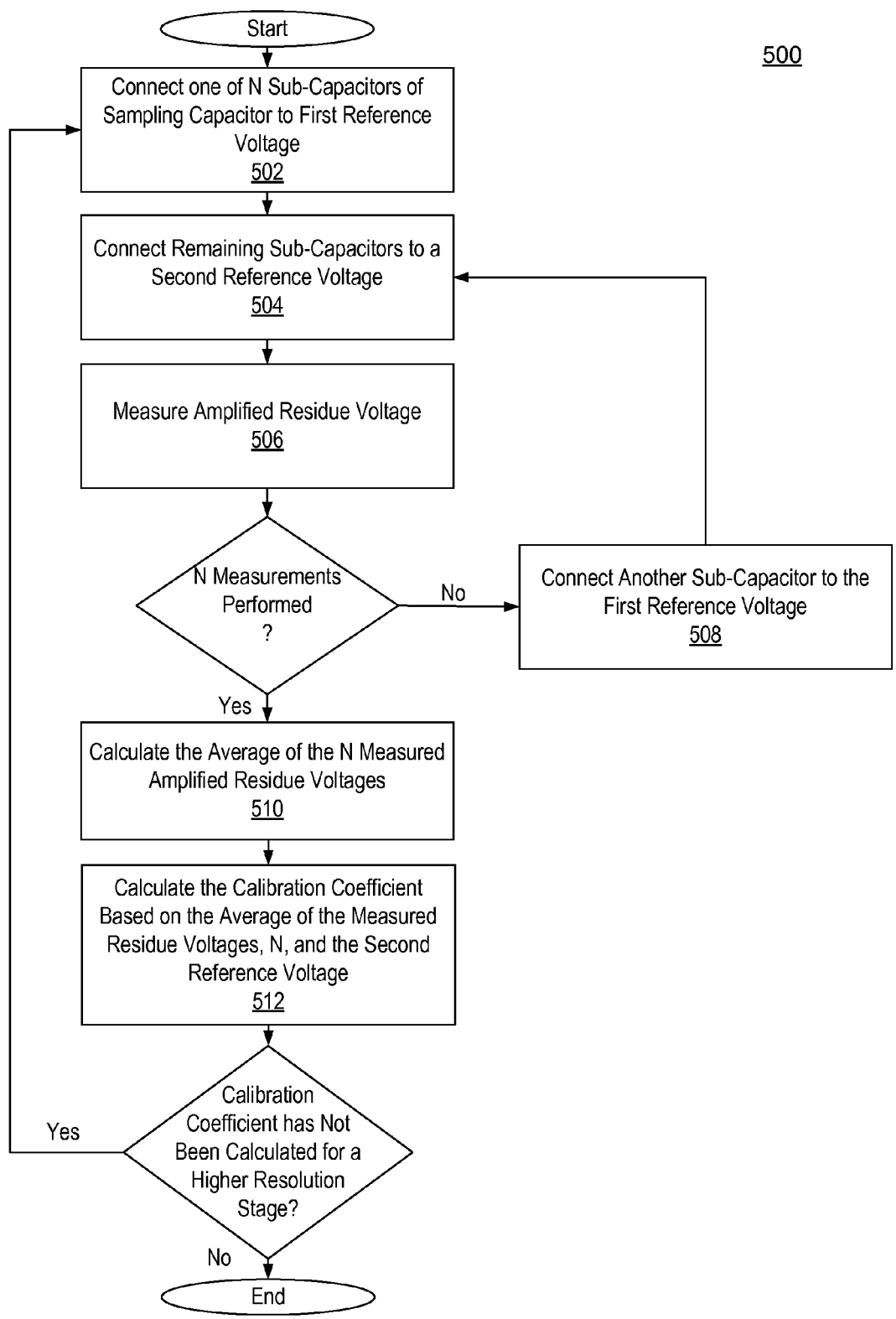
FIG. 5 is a flow chart illustrating the determination of the calibration coefficients of a pipeline ADC's calibrated stages during foreground calibration, according to one embodiment.

FIG. 5 is a flow chart 500 illustrating the determination of the calibration coefficients of the pipeline ADC's 100 calibrated stages 104 during foreground calibration, according to one embodiment. Other embodiments can perform the steps of FIG. 5 in different orders. Moreover, other embodiments can include different and/or additional steps than the ones described here.

Assume for purposes of this example that foreground calibration begins with determining the calibration coefficient of the lowest resolution calibrated stage 104N included in the pipeline ADC 100. Additionally, assume that when determining the calibration coefficient of a calibrated stage 104, the sampling capacitor $C_S$ 306 of the MDAC 204 included in the stage 104 is made up of N sub-capacitors, that dither capacitor $C_D$ 308 is connected to ground, and feedback capacitor $C_F$ 304 is connected to the output 320C of the amplifier 302.

To begin the process of determining the calibration coefficient of the lowest resolution calibrated stage 104N, one of the N sub-capacitors of the sampling capacitor $C_S$ 306 is connected 502 to a first reference voltage (e.g., ground). Additionally, the remaining N−1 sub-capacitors are connected 504 to a second reference voltage (e.g., a positive reference voltage). In other words, a set of the N sub-capacitors are connected to the second reference voltage. The uncalibrated backend ADC 116 measures 506 the amplified residue voltage 108 of the stage 104.

If the N measurements have not been performed, another of the sub-capacitors is connected 508 to the first reference voltage and steps 504 through 508 are repeated. A sub-capacitor can only be connected to ground once during the N measurements.

If the N measurements are performed, the calibration and error correction circuit 112 calculates 510 the average of the N measured residue voltages. The calibration and error correction circuit 112 calculates 512 the calibration coefficient of the stage 104 based on the average of the measured residue voltages, N, and the second reference voltage. If there is a higher resolution calibrated stage 104 for which the calibration coefficient has not been calculated during this cycle of foreground calibration, steps 502-512 are repeated for the next higher resolution stage 104.

Additional Configuration Considerations

Although the subject matter was described in the context of a pipeline ADC, the principles described may be applied to any electronic device that contains a switched-capacitor circuit or MDAC. For example, the subject matter described may also be applied to other types of ADCs that include a MDAC.

Upon reading this disclosure, those of skill in the art will appreciate still additional alternative structural and functional designs for a system and a process for determining the calibration coefficients of pipeline ADC stages through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A pipeline analog-to-digital converter comprising:
a plurality of calibrated stages, each of the plurality of calibrated stages comprising:
an amplifier generating an output representing an amplified difference between a first voltage at an input of the amplifier and a second voltage at another input of the amplifier; and
a sampling capacitor comprising a plurality of sub-capacitors, each of the plurality of sub-capacitors having a first terminal coupled to the input of the amplifier and a second terminal selectively coupled to a first reference voltage or a second reference voltage higher than the first reference voltage in a calibration mode or an input voltage of each of the plurality of stages in an operational mode subsequent to the calibration mode; and
a correction circuit coupled to the plurality of calibrated stages and configured, for each of the plurality of calibrated stages, to:
receive a plurality of measurements of the output of the amplifier performed in calibration mode, during each of the plurality of measurements, the second terminal of at least one of the plurality of sub-capacitors coupled to the first reference voltage;

determine a calibration coefficient for the calibrated stage based on the received plurality of measurements; and compensate, in operation mode, for a gain error of the calibrated stage based on the determined calibration coefficient.

2. The pipeline analog-to-digital converter of claim 1, wherein during each of the plurality of measurements, the second terminal of a single sub-capacitor of the plurality of sub-capacitors is coupled to the first reference voltage and the second terminal of a remainder of the plurality of sub-capacitors is coupled to the second reference voltage, the second terminal of each of the plurality sub-capacitors is coupled to the first reference voltage for at most one of the plurality of measurements.

3. A pipeline analog-to-digital converter comprising:
a plurality of calibrated stages, each of the plurality of calibrated stages comprising:
an amplifier generating an output representing an amplified difference between a first voltage at an input of the amplifier and a second voltage at another input of the amplifier; and
a sampling capacitor comprising a plurality of sub-capacitors, each of the plurality of sub-capacitors having a first terminal coupled to the input of the amplifier and a second terminal selectively coupled to a first reference voltage or a second reference voltage higher than the first reference voltage in a calibration mode; and
a correction circuit coupled to the plurality of calibrated stages and configured, for each of the plurality of calibrated stages, to:
receive a plurality of measurements of the output of the amplifier responsive to connecting second terminals of different sub-capacitors to the first reference voltage in the calibration mode;
determine a calibration coefficient for the calibrated stage based on the received plurality of measurements; and
compensate, in an operational mode subsequent to the calibration mode, for a gain error of the calibrated stage based on the determined calibration coefficient.

4. The pipeline analog-to-digital converter of claim 3, wherein each of the plurality of sub-capacitors have the same capacitance.

5. The pipeline analog-to-digital converter of claim 3, wherein second terminals of remaining sub-capacitors are connected to the second reference voltage.

6. The pipeline analog-to-digital converter of claim 3, wherein the second terminal of each of the plurality of sub-capacitors is selectively coupled to an input voltage of each of the plurality of stages in the operational mode.

7. The pipeline analog-to-digital converter of claim 3, wherein during each of the plurality of measurements, a second terminal of a single sub-capacitor of the plurality of sub-capacitors is coupled to the first reference voltage and second terminals of a remainder of the plurality of sub-capacitors are coupled to the second reference voltage.

8. The pipeline analog-to-digital converter of claim 3, wherein the second terminal of each of the plurality sub-capacitors is coupled to the first reference voltage for at most one of the plurality of measurements in a cycle of the calibration mode.

9. The pipeline analog-to-digital converter of claim 3, wherein a number of the plurality of measurements performed in a cycle of the calibration mode is equal to a number of the plurality of sub-capacitors.

10. The pipeline analog-to-digital converter of claim 3, wherein each of the plurality of calibrated stages further comprises:
a dither capacitor having a first terminal coupled to the input of the amplifier and a second terminal coupled to the first reference voltage in the calibration mode; and
a feedback capacitor having a first terminal coupled to the input of the amplifier and a second terminal coupled to the output of the amplifier in the calibration mode.

11. The pipeline analog-to-digital converter of claim 10, wherein the first terminal of the dither capacitor is coupled to the input of the amplifier and the second terminal is coupled to the first reference voltage in the operational mode.

12. The pipeline analog-to-digital converter of claim 10, wherein the first terminal of the feedback capacitor is coupled to the input of the amplifier and the second terminal is coupled to an input voltage in the operational mode.

13. The pipeline analog-to-digital converter of claim 10, wherein each of the plurality of sub-capacitors have the same capacitance as the dither capacitor.

14. The pipeline analog-to-digital converter of claim 3, wherein the calibration coefficient is determined for each of the plurality of stages based on an average of the plurality of measurements performed for each of the plurality of stages, a value of the second reference voltage, and a number of the plurality of sub-capacitors.

15. The pipeline analog-to-digital converter of claim 3, wherein the gain error of a calibrated stages is compensated for by:
multiplying first bits generated by one or more lower resolution stages and a flash analog-to-digital converter by the calibration coefficient determined for the calibrated stage;
multiplying second bits generated by the calibrated stage by $2^{(b-1)}$, where b is a resolution of the one or more lower resolution stages and the flash analog-to-digital converter; and
summing the multiplied first bits and the multiplied second bits.

16. The pipeline analog-to-digital converter of claim 3, wherein during the calibration mode, the correction circuit is further configured to:
perform an additional measurement at the output of the amplifier, during the additional measurement, the second terminal of each of the plurality of sub-capacitors coupled to the second reference voltage, a first terminal of a dither capacitor coupled to the input of the amplifier, and a second terminal of the dither capacitor coupled to a third reference voltage; and
calculate a ratio based on the additional measurement and an average of the plurality of measurements.

17. The pipeline analog-to-digital converter of claim 16, wherein a Pseudo-Random Binary Sequence (PRBS) is injected through the second terminal during the operational mode, and the correction circuit is further configured to adjust a value of the calibration coefficient of the calibrated stage based on remnants of PRSB remaining after subtracting the injected PRBS from bits generated by the one or more lower resolution stages and a flash analog-to-digital converter.

18. A method comprising:
- receiving a first voltage from first terminals of a plurality of sub-capacitors forming a sampling capacity by an input of an amplifier of a stage in a pipeline analog-to-digital converter;
- coupling second terminals of different sub-capacitors to a first reference voltage or a second reference voltage higher than the first reference voltage in a calibration mode;
- generating amplified differences between the first voltage and a second voltage at another input of the amplifier in the calibration mode;
- taking a plurality of measurements of the amplified differences responsive to connecting the second terminals of different sub-capacitors to the first reference voltage or the second reference voltage in the calibration mode;
- determining a calibration coefficient for the stage based on the plurality of measurements; and
- compensating, in an operational mode subsequent to the calibration mode, a gain error of the stage based on the determined calibration coefficient.

19. The method of claim 18, wherein during each of the plurality of measurements, a second terminal of a single sub-capacitor of the plurality of sub-capacitors is coupled to the first reference voltage and the second terminals of a remainder of the plurality of sub-capacitors are coupled to the second reference voltage.

20. The method of claim 18, wherein a second terminal of each of the plurality of sub-capacitors is coupled to the first reference voltage for at most one of the plurality of measurements in a cycle of the calibration mode.

* * * * *